(12) United States Patent
Hill et al.

(10) Patent No.: US 12,426,387 B2
(45) Date of Patent: Sep. 23, 2025

(54) ATOMIC LAYER-BASED SURFACE TREATMENTS FOR INFRARED DETECTORS

(71) Applicant: California Institute of Technology, Pasadena, CA (US)

(72) Inventors: Cory J. Hill, Chesterfield, MO (US); Harold Frank Greer, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 393 days.

(21) Appl. No.: 18/049,424

(22) Filed: Oct. 25, 2022

(65) Prior Publication Data

US 2023/0129191 A1    Apr. 27, 2023

Related U.S. Application Data

(60) Provisional application No. 63/271,531, filed on Oct. 25, 2021.

(51) Int. Cl.
*H10F 39/00* (2025.01)
*H10F 39/18* (2025.01)

(52) U.S. Cl.
CPC ......... *H10F 39/028* (2025.01); *H10F 39/021* (2025.01); *H10F 39/184* (2025.01)

(58) Field of Classification Search
CPC ......... H01L 27/14698; H01L 27/14649; H01L 27/14694
See application file for complete search history.

(56) References Cited

U.S. PATENT DOCUMENTS

| | | |
|---|---|---|
| 4,679,063 A | 7/1987 | White |
| 4,843,439 A | 6/1989 | Cheng |
| 5,194,983 A | 3/1993 | Voisin et al. |

(Continued)

FOREIGN PATENT DOCUMENTS

| | | |
|---|---|---|
| CN | 111900217 A | 11/2020 |
| WO | 2005004243 A1 | 1/2005 |

(Continued)

OTHER PUBLICATIONS

Yang et al., Ultrathin high-κ antimony oxide single crystals, May 19, 2020, FIG. 1 (Year: 2020).*

(Continued)

*Primary Examiner* — Shih Tsun A Chou
*Assistant Examiner* — Jonathan Keith Little
(74) *Attorney, Agent, or Firm* — KPPB LLP

(57) ABSTRACT

Disclosed herein is a method of producing an infrared detector. In certain embodiments, the method includes: forming a planar multi-layer structure including an absorber including a superlattice structure; patterning the planar multi-layer structure; etching the planar multi-layer structure to define a plurality of pixels, the sidewalls of the plurality of pixels includes a sidewall roughness and multiple types of surface oxides; and performing a surface treatment process to the plurality of pixels in order to reduce the sidewall roughness and replace the surface oxides with a chlorinated surface morphology. The surface treatment process may reduce surface current of the infrared detector which may decrease the dark current in the infrared detector.

19 Claims, 6 Drawing Sheets

(56) References Cited

U.S. PATENT DOCUMENTS

| | | |
|---|---|---|
| 5,536,948 A | 7/1996 | Lee |
| 6,226,152 B1 | 5/2001 | Tanaka et al. |
| 6,433,354 B1 | 8/2002 | Kuan et al. |
| 6,455,908 B1 | 9/2002 | Johnson et al. |
| 7,442,599 B2 | 10/2008 | Maa et al. |
| 7,633,083 B2 | 12/2009 | Lester et al. |
| 7,687,871 B2 | 3/2010 | Maimon |
| 7,795,640 B2 | 9/2010 | Klipstein |
| 7,928,473 B2 | 4/2011 | Klipstein |
| 8,022,390 B1 | 9/2011 | Kim et al. |
| 8,217,480 B2 | 7/2012 | Ting et al. |
| 8,410,523 B2 | 4/2013 | Huffaker et al. |
| 8,928,029 B2 | 1/2015 | Ting et al. |
| 9,214,581 B2 | 12/2015 | Arezou et al. |
| 9,647,164 B2 | 5/2017 | Ting et al. |
| 9,799,785 B1 | 10/2017 | Ting et al. |
| 9,831,372 B2 | 11/2017 | Khoshakhlagh et al. |
| 10,872,987 B2 | 12/2020 | Ting et al. |
| 2002/0027238 A1 | 3/2002 | Lin et al. |
| 2003/0064248 A1 | 4/2003 | Wolk et al. |
| 2003/0209708 A1 | 11/2003 | Kubota |
| 2007/0215900 A1 | 9/2007 | Maimon |
| 2007/0235758 A1 | 10/2007 | Klipstein |
| 2008/0111152 A1 | 5/2008 | Scott et al. |
| 2009/0084958 A1 | 4/2009 | Vogt |
| 2009/0127462 A1 | 5/2009 | Gunapala et al. |
| 2009/0224228 A1 | 9/2009 | Razeghi |
| 2009/0256231 A1 | 10/2009 | Klipstein |
| 2010/0006822 A1 | 1/2010 | Ting et al. |
| 2010/0072514 A1 | 3/2010 | Ting et al. |
| 2010/0155777 A1 | 6/2010 | Hill et al. |
| 2010/0230720 A1 | 9/2010 | Wicks |
| 2011/0037097 A1 | 2/2011 | Scott et al. |
| 2012/0022362 A1 | 1/2012 | Caruba et al. |
| 2012/0145996 A1 | 6/2012 | Ting et al. |
| 2012/0199185 A1 | 8/2012 | Yang |
| 2013/0062593 A1 | 3/2013 | Jones et al. |
| 2013/0146998 A1 | 6/2013 | Ting et al. |
| 2014/0225064 A1 | 8/2014 | Khoshakhlagh et al. |
| 2014/0332755 A1 | 11/2014 | Wei |
| 2014/0374701 A1 | 12/2014 | Wei |
| 2015/0145091 A1 | 5/2015 | Ting et al. |
| 2016/0336476 A1 | 11/2016 | Khoshakhlagh et al. |
| 2018/0211844 A1* | 7/2018 | Lin .................. H01L 21/02046 |
| 2019/0013427 A1 | 1/2019 | Ting et al. |
| 2020/0292391 A1* | 9/2020 | Suzuki .................. H01L 31/105 |
| 2023/0114881 A1 | 4/2023 | Ting et al. |

FOREIGN PATENT DOCUMENTS

| | | |
|---|---|---|
| WO | 2008061141 A1 | 5/2008 |
| WO | 2010006269 A1 | 1/2010 |

OTHER PUBLICATIONS

Sun et al., HCl Flow-Induced Phase Change of α-, β-, and ε-Ga2O3 Films Grown by MOCVD, Mar. 6, 2018, FIGS. 3b, 5a (Year: 2018).*

International Preliminary Report on Patentability for International Application PCT/US2009/050268, Report issued Jan. 11, 2011, Mailed Jan. 20, 2011, 4 pgs.

International Search Report and Written Opinion for International Application No. PCT/US2009/050268, Search completed Sep. 27, 2009, Mailed Oct. 7, 2009, 5 pgs.

Arias et al., "HgCdTe dual-band infrared photodiodes grown by molecular beam epitaxy", Journal of Applied Physics, vol. 70, No. 8, Oct. 15, 1991, pp. 4620-4622, doi: 10.1063/1.349099.

Ashley et al., "Operation and properties of narrow-gap semiconductor devices near room temperature using non-equilibrium techniques", Semiconductor Science and Technology, vol. 6, No. 12C, 1991, pp. C99-C105, doi: 10.1088/0268-1242/6/12c/020.

Blazejewski et al., "Bias-switchable dual-bank HgCdTe infrared photodetector", Journal of Vacuum Science & Technology B, vol. 10, No. 4, Jul. 1, 1992, pp. 1626-1632, doi: 10.1116/1.586259.

Byun et al., "Heterojunction fabrication by selective area chemical vapor deposition induced by synchrotron radiation", Applied Physics Letters, vol. 64, No. 15, Apr. 11, 1994, pp. 1968-1970, doi: 10.1063/1.111758.

Carras et al., "Generation-recombination reduction in InAsSb photodiodes", Semiconductor Science and Technology, vol. 21, No. 12, Nov. 9, 2006, pp. 1720-1723, doi: 10.1088/0268-1242/21/12/037.

Carras et al., "Interface band gap engineering in InAsSb photodiodes", Applied Physics Letters, vol. 87, No. 10, Sep. 1, 2005, pp. 102103-1-102103-3, doi: 10.1063/1.2041818.

Gautam et al., "Performance improvement of longwave infrared photodetector based on type-II InAs/GaSb superlattices using unipolar current blocking layers", Applied Physics Letters, vol. 96, No. 23, 231107, Jun. 8, 2010, pp. 231107-1-231107-3, doi: 10.1063/1.3446967.

Ghosh et al., "Fabrication of the SnS/ZnO heterojunction for PV applications using electrodeposited ZnO films", Semiconductor Science and Technology, vol. 24, No. 2, Jan. 20, 2009, pp. 025024-1-025024-7, doi: 10.1088/0268-1242/24/2/025024.

Gotoh et al., "Molecular Beam Epitaxy of AlSb on GaAs and GaSb on AlSb Films", Physica Status Solidi (a), vol. 75, No. 2, Jun. 1, 1983, pp. 641-645, doi: 10.1002/pssa.2210750239.

Hill et al., "Demonstration of large format mid-wavelength infrared focal plane arrays based on superlattice and BIRD detector structures", Infrared Physics & Technology, vol. 52, No. 6, Nov. 2009, pp. 348-352, doi: 10.1016/j.infrared.2009.09.007.

Hoffman et al., "The effect of doping the M-barrier in very longwave type II in As/GaSb heterodiodes", Applied Physics Letters, vol. 93, No. 3, 031107, Jul. 23, 2008, 3 pgs., doi: 10.1063/1.2963980.

Hoglund et al., "Influence of radiative and non-radiative recombination on the minority carrier lifetime in midwave infrared InAs/InAsSb superlattices", Applied Physics Letters, vol. 103, No. 22, 221908, Nov. 26, 2013, pp. 221908-1-221908-5, doi: 10.1063/1.4835055.

Huang et al., "Epitaxial growth and characterization of InAs/GaSb and InAs/InAsSb type-II superlattices on GaSb substrates by metalorganic chemical vapor depositions for long wavelength infrared photodetectors", Journal of Crystal Growth, vol. 314, No. 1, Jan. 2011, pp. 92-96, doi: 10.1016/j.jcrysgro.2010.11.003.

Huang et al., "Strain relief by periodic misfit arrays for low defect density GaSb on GaAs", Applied Physics Letters, vol. 88, No. 13, 131911, Mar. 30, 2006, pp. 131911-1-131911-3, doi: 10.1063/1.2172742.

Johnson et al., "Electrical and optical properties of infrared photodiodes using the InAs/Ga1-xInXSb superlattice in heterojunctions with GaSb", Journal of Applied Physics, vol. 80, No. 2, Jul. 15, 1996, pp. 1116-1127, doi: 10.1063/1.362849.

Kazzi et al., "Interplay between Sb flux and growth temperature during the formation of GaSb islands on GaP", Journal of Applied Physics, vol. 111, No. 12, 123506, Jun. 19, 2012, pp. 123506-1-123506-5, doi: 10.1063/1.4729548.

Khoshakhlagh et al., "Bias dependent dual band response from InAs/Ga(In)Sb type II strain layer superlattice detectors", Applied Physics Letters, vol. 91, No. 26, Dec. 27, 2007, pp. 263504-1-263504-3, doi: 10.1063/1.2824819.

Khoshakhlagh et al., "Long-Wave InAs/GaSb Superlattice Detectors Based on nBn and Pin Designs", IEEE Journal of Quantum Electronics, vol. 46, No. 6, Jun. 6, 2010, pp. 959-964, doi: 10.1109/jqe.2010.2041635.

Kim et al., "Long-wave infrared nBn photodetectors based on INAs/InAsSb type-II superlattices", Applied Physics Letters, vol. 101, No. 16, 161114, Oct. 18, 2012, pp. 161114-1-161114-3, doi: 10.1063/1.4760260.

Kim et al., "Mid-IR focal plane array based on type-II InAs/GaSb strain layer superlattice detector with nBn design", Applied Physics Letters, vol. 92, No. 18, 183502, May 7, 2008, pp. 183502-1-183502-3, doi: 10.1063/1.2920764.

(56) References Cited

OTHER PUBLICATIONS

Klipstein, ""XBn" Barrier Photodetectors for High Sensitivity and High Operating Temperature Infrared Sensors", Proceedings of SPIE, Infrared Technology and Applications XXXIV, vol. 6940, Apr. 2008, pp. 69402U-1-69402U-12, doi: 10.1117/12.778848.
Klipstein et al., "XBn" Barrier Detectors for High Operating Temperatures, Proceedings of SPIE, Quantum Sensing and Nanophotonic Devices VII, vol. 7608, 76081V, Jan. 22, 2010, pp. 76081V-1-76081V-10, doi: 10.1117/12.841585.
Lackner et al., "Growth of InAsSb/InAs MQWs on GaSb for mid-IR photodetector applications", Journal of Crystal Growth, vol. 311, No. 14, May 5, 2009, pp. 3563-3567, doi: 10.1016/j.jcrysgro.2009.04.027.
Lackner et al., "InAsSb and InPSb Materials for Mid Infrared Photodetectors", 22nd International Conference on Indium Phosphide and Related Materials (IPRM), 2010, 4 pgs., doi: 10.1109/ICIPRM.2010.5515974.
Lackner et al., "Strain balanced InAs/InAsSb superlattice structures with optical emission to 10 um", Applied Physics Letters, vol. 95, No. 8, 081906, Aug. 26, 2009, pp. 081906-1-081906-3, doi: 10.1063/1.3216041.
Lin et al., "Minority Carrier Lifetime in Beryllium-Doped InAs/InAsSb Strained Layer Superlattices", Journal of Electronic Material, vol. 43, No. 9, Jun. 3, 2014, pp. 3184-3190, doi: 10.1007/s11664-014-3239-6.
Magden, "Effects of Strain Release via Interfacial Misfit Arrays on the Optical Properties of GaSb/GaAs Heterojunctions", Senior Honors Thesis, 2012, 59 pgs.
Maimon et al., "InAsSb/GlaAISb/1nAsSb nBn IR detector for the 3-5μm", Abstract Book of the 11th International Conference on Narrow Gap Semiconductors, Buffalo, New York, 2003, p. 70.
Maimon et al., "nBn detector, an infrared detector with reduced dark current and higher operating temperature", Applied Physics Letters, vol. 89, No. 15, 151109, Oct. 10, 2006, pp. 151109-1-151109-3, doi: 10.1063/1.2360235.
Marozas et al., "Surface dark current mechanisms in III-V infrared photodetectors [Invited]", Optical Materials Express, vol. 8, No. 6, 1419, Jun. 1, 2018, pp. 1419-1424, doi: 10.1364/ome.8.001419.
Nguyen et al., "Background limited long wavelength infrared type-II InAs/SaSb superlattice photodiodes operating at 110 K", Applied Physics Letter, vol. 93, No. 12, 123502, Sep. 22, 2008, pp. 123502-1-123502-3, doi: 10.1063/1.2978330.
Nguyen et al., "Dark current suppression in type II InAs/GaSb superlattice long wavelength infrared photodiodes with M-structure barrier", Applied Physics Letters, vol. 91, No. 16, 163511, Oct. 18, 2007, 3 pgs., doi: 10.1063/1.2800808.
Plis et al., "Lateral diffusion of minority carriers in InAsSb-based nBn detectors", Applied Physics Letters, vol. 97, No. 12, Sep. 22, 2010, pp. 123503-1-123503-3, doi: 10.1117/12.873316.
Plis et al., "Lateral diffusion of minority carriers in nBn based type-II InAs/GaSb strained layer superlattice detectors", Applied Physics Letters, vol. 93, No. 12, 123507, Sep. 24, 2008, pp. 123507-1-123507-3, doi: 10.1063/1.2990049.
Reine et al., "Independently Accessed Back-to-Back HgCdTe Photodiodes: A New Dual-Band Infrared Detector", Journal of Electronic Materials, vol. 24, No. 5, May 1995, pp. 669-679, doi: 10.1007/BF02657977.
Reverchon et al., "Design and fabrication of infrared detectors based on lattice-matched InAs0.91Sb0.09 on GaSb", Physica E: Low-Dimensional Systems and Nanostructures, vol. 20, No. 3-4, Jan. 2004, pp. 519-522. doi: 10.1016/j.physe.2003.09.001.
Reyner et al., "Characterization of GaSb/GaAs interfacial misfit arrays using x-ray diffraction", Applied Physics Letters, vol. 99, No. 23, 231906, Dec. 8, 2011, pp. 231906-1-231906-3, doi: 10.1063/1.3666234.
Rogalski, "Heterostructure infrared photovoltaic detectors", Infrared Physics & Technology, vol. 41, No. 4, Feb. 18, 2000, pp. 213-238, doi: 10.1016/s1350-4495(00)00042-6.
Savich et al., "Dark current filtering in unipolar barrier infrared detectors", Applied Physics Letters, vol. 99, 121112, Sep. 22, 2011, pp. 121112-1-121112-3, doi: 10.1063/1.3643515.
Steenbergen et al., "Significantly improved minority carrier lifetime observed in a long-wavelength infrared III-V type-II superlattice comprised of InAs/InAsSb", Applied Physics Letters, vol. 99, No. 25, 251110, Dec. 22, 2011, pp. 251110-1-251110-3, doi: 10.1063/1.3671398.
Tatebayashi et al., "Monolithically Integrated III-Sb-Based Laser Diodes Grown on Miscut Si Substrates", IEEE Journal of Selected Topics in Quantum Electronics, vol. 15, No. 3, May/Jun. 2009, pp. 716-723, doi: 10.1109/jstqe.2009.2015678.
Tennant, "Rule 07" Revisited: Still a Good Heuristic Predictor of p/n HgCdTe Photodiode Performance?, Journal of Electronic Materials, vol. 39, No. 7, Feb. 6, 2010, pp. 1030-1035, doi: 10.1007/s11664-010-1084-9.
Ting et al., "A high-performance long wavelength superlattice complementary barrier infrared detector", Applied Physics Letters, vol. 95, No., 2, 023508, Jul. 16, 2009, pp. 023508-1-023508-3, doi: 10.1063/1.3177333.
Ting et al., "Antimonide superlattice barrier infrared detectors", Proceedings of SPIE, Infrared Systems and Photoelectronic Technology IV, vol. 7419, 74190B, Aug. 27, 2009, pp. 74190B-1-74190B-12, doi: 10.1117/12.829047.
Ting et al., "Development of type-II superlattice long wavelength infrared focal plane arrays for land imaging", Infrared Physics & Technology, vol. 123, 104133, Jun. 2022, 26 pgs.
Ting et al., "Exclusion, extraction, and junction placement effects in the complementary barrier infrared detector", Applied Physics Letters, vol. 102, No. 12, Mar. 26, 2013, pp. 121109-1-121109-4, doi: 10.1063/1.4798551.
Ting et al., "Long wavelength InAs/InAsSb superlattice barrier infrared detectors with ρ-type absorber quantum efficiency enhancement", Applied Physics Letters, vol. 118, No. 13, 133503, Mar. 30, 2021, pp. 133503-1-133503-5, doi: 10.1063/5.0047937.
Ting et al., "Mid-wavelength high operating temperature barrier infrared detector and focal plane array.", Applied Physics Letters, vol. 113, No. 2, 021101, Jul. 10, 2018, pp. 021101-1-021101-4, doi: 10.1063/1.5033338.
Wang et al., "Strain relief at the GaSb/GaAs interface versus substrate surface treatment and AISb interlayers thickness", Journal of Applied Physics, vol. 109, No. 2, 023509, Jan. 19, 2011, pp. 023509-1-023509-6, doi: 10.1063/1.3532053.
Weiss et al., "InAsSb-based XBnn bariodes grown by molecular beam epitaxy on GaAs", Journal of Crystal Growth, vol. 339, No. 1, Jan. 2012, pp. 31-35, doi: 10.1016/j.jcrysgro.2011.11.076.
Wicks et al., "Infrared detector epitaxial designs for suppression of surface leakage current", Proceedings of SPIE: Quantum Sensing and Nanophotonic Devices VII, vol. 7608, 760822, Jan. 23, 2010, pp. 760822-1-760822-8, doi: 10.1117/12.842427.
Wilk et al., "Type-II InAsSb/InAs strained quantum-well laser diodes emitting at 3.2um", Applied Physics Letters, vol. 77, No. 15, Oct. 9, 2000, pp. 2298-2300, doi: 10.1063/1.1317537.
Zhang, "Continuous wave operation of InAS/InAsxsb1-x midinfrared lasers", Applied Physics Letters, vol. 66, No. 2, Jan. 9, 1995, pp. 118-120, doi: 10.1063/1.113535.
Zhang, "InAs/InAsxSb1-x type-II superlattice Midwave Infrared Lasers", Antimonide-Related Strained-Layer Heterostructures, edited by M. O. Manasreh, Gordon and Breach Science Publishers, Amsterdam, 1997, 10 pgs.
Zhou et al., "Molecular Beam Epitaxy of GaSb on GaAs Substrates with AISb Buffer Layers", Chinese Physics Letters, vol. 26, No. 1, 018101, 2009, pp. 01810-1-01810-3, doi: 10.1088/0256-307x/26/1/018101.

\* cited by examiner

ATOMIC LAYER-BASED SURFACE TREATMENTS FOR INFRARED DETECTORS

CROSS-REFERENCE TO RELATED APPLICATIONS

This application claims the benefit of and priority under 35 U.S.C. § 119(e) to U.S. Provisional Patent Application Ser. No. 63/271,531, entitled "III-V Detector Performance Using Atomic Layer-Based Surface Treatments" to Hill et al., filed Oct. 25, 2021, which is incorporated herein by reference in its entirety for all purposes.

This invention was made with government support under Grant No. 80NMO0018D0004 awarded by NASA (JPL). The government has certain rights in the invention.

FIELD OF THE INVENTION

The present invention generally relates to a system and method of decreasing infrared detector surface current through use of a surface treatment.

BACKGROUND

Infrared detectors may be useful for various purposes such as atmospheric sounding, as well as Earth and Planetary observation. Infrared detector arrays may take the images or spectrographic data that form the data product of the instruments. The performance of the detectors may be important. Barrier-InfraRed Detector (BIRD) technology is rapidly displacing InSb technology in middle wavelength infrared (MWIR) imaging arrays. However, surface leakage contributing to dark current may be one of the main issues in preventing MWIR imaging arrays from taking over in the long wavelength infrared (LWIR) and very long wavelength infrared (VLWIR).

During the design and fabrication of high performance BIRDs that are flexible in the cutoff wavelength from the Near InfraRed (NIR, ~1.0 micron) to the Very Long Wavelength InfraRed (>15 microns), exposing the surfaces to these materials during the pixel delineation step of detector fabrication exposes surfaces which may form paths for excess noise in the form of surface current. This surface current severely limits the performance of the detectors and hence their applicability.

SUMMARY OF THE INVENTION

Systems and methods in accordance with various embodiments of the invention may include a method of producing an infrared detector. The method may include: forming a planar multi-layer structure including an absorber including a superlattice structure; patterning the planar multi-layer structure; etching the planar multi-layer structure to define a plurality of pixels, where the sidewalls of the plurality of pixels includes a sidewall roughness and multiple types of surface oxides; and performing a surface treatment process to the plurality of pixels in order to reduce the sidewall roughness and replace the surface oxides with a chlorinated surface morphology.

In various other embodiments, the planar multi-layer structure further includes a unipolar barrier layer and a contact layer.

In still various other embodiments, the contact layer includes a superlattice structure.

In still various other embodiments, the superlattice structure of the contact layer includes a compound semiconductor.

In still various other embodiments, the compound semiconductor includes InAs and InAsSb.

In still various other embodiments, the multiple types of surface oxides include indium oxide, arsenic oxide, and antimony oxide.

In still various other embodiments, the infrared detector is a barrier infrared detector.

In still various other embodiments, the superlattice structure of the absorber includes a compound semiconductor.

In still various other embodiments, the compound semiconductor includes InAs and InAsSb.

In still various other embodiments, the multiple types of surface oxides include indium oxide, arsenic oxide, and antimony oxide.

In still various other embodiments, the surface treatment process includes a first atomic layer etching process followed by a second atomic layer deposition process.

In still various other embodiments, the first atomic layer etching process includes cyclically and alternately: exposing the sidewalls of the plurality of pixels to a fluorocarbon reactant; and exposing the sidewalls of the plurality of pixels to an ionized argon gas.

In still various other embodiments, the fluorocarbon reactant may be $CHF_3$ gas.

In still various other embodiments, exposing the sidewalls of the plurality of pixels to the fluorocarbon reactant is between 20-80 seconds.

In still various other embodiments, exposing the sidewalls to the fluorocarbon reactant is performed with substantially no bias.

In still various other embodiments, exposing the sidewalls to the ionized argon gas includes exposing the sidewalls to argon gas with a bias.

In still various other embodiments, the bias is higher than a bias applied when exposing the sidewalls to the fluorocarbon reactant.

In still various other embodiments, the second atomic layer etching process includes cyclically and alternately: exposing the sidewalls of the plurality of pixels to a chlorine reactant; and exposing the sidewalls of the plurality of pixels to an ionized argon gas.

In still various other embodiments, the chlorine reactant includes chlorine argon plasma.

In still various other embodiments, exposing the sidewalls to the chlorine reactant is less than 100 ms.

In still various other embodiments, exposing the sidewalls to the ionized argon gas is less than 100 ms.

In still various other embodiments, the second atomic layer etching process treats the sidewalls with a chlorinated III-V compound.

BRIEF DESCRIPTION OF THE DRAWINGS

The description will be more fully understood with reference to the following figures and data graphs, which are presented as various embodiment of the disclosure and should not be construed as a complete recitation of the scope of the disclosure, wherein.

DETAILED DESCRIPTION

The disclosed technology relates to a highly manufacturable surface treatment applied to these infrared detector components. The surface treatment may include passivation and encapsulation of the surface of infrared detectors after pixel delineation. Pixel delineation may produce unwanted surface defects. Some infrared detectors may include superlattice structure which layers different compound semiconductor materials. These compound semiconductor materials may be III-V semiconductor materials. For example, the compound semiconductor may be indium arsenic (InAs) and/or indium arsenic antimony (InAsSb). When exposed to air after pixel delineation, the compound semiconductor may produce multiple different oxides. For example, in the case of InSb, indium oxide and antimony oxide may be produced. These different oxides create a rough and undesirable surface. These surface oxides may lead to undesirable surface current which may lead to dark current which may limit the performance of the infrared sensor.

The disclosed surface treatment applied after pixel delineation may remove the surface oxides and instead convert the surface into a stable surface which may decease surface current and increase performance of the infrared sensor. In some embodiments, the surface treatment may apply a chlorine-based surface which may decrease future growth of surface oxides and also have advantageous properties which limit surface current. The decreased surface current may decrease dark current which may increase device performance.

The surface treatment may includes atomic layer etching (ALE) and atomic layer deposition (ALD). With ALE, a layer is deposited, then ALE is utilized to etch this layer into the proper encapsulation semiconductor layer. With ALD, the encapsulation semiconductor layer is deposited utilizing an ALD process. In each case, the process is controlled so it is limited to a single layer, which can then be ended or repeated at will.

When specific ALE and ALD treatments are applied to BIRD detectors, the cleaned and encapsulated semiconductor layer decreases the surface leakage current which may improve the device performance metrics by several orders of magnitude.

The ALE treatment may be a clean-etch. The ALE and/or ALD process may not have atomic layer specificity, may be highly anisotropic, and/or may still leave areas untreated or over-treated. The ALE/ALD technology is targeted, highly isotropic (e.g. penetrates into all etched vertical or horizontal surfaces uniformly), and/or highly controllable.

These properties make the ALE/ALD approach far more deterministic in outcome and much more repeatable, making it suitable for both R&D and high-volume manufacturing.

Figure 1A:
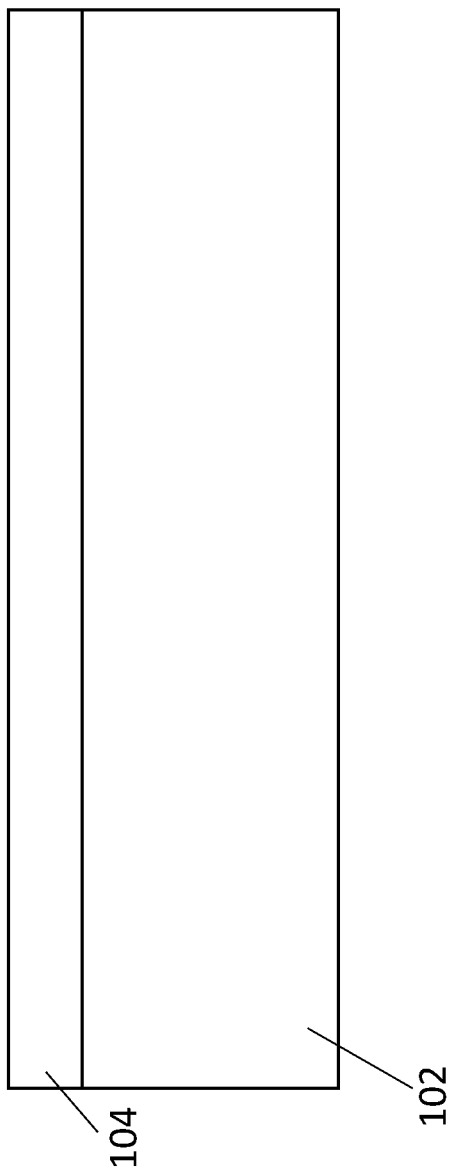
FIG. 1A-1C conceptually illustrate a process for creating an infrared detector in accordance with an embodiment of the invention.
Figure 1B:
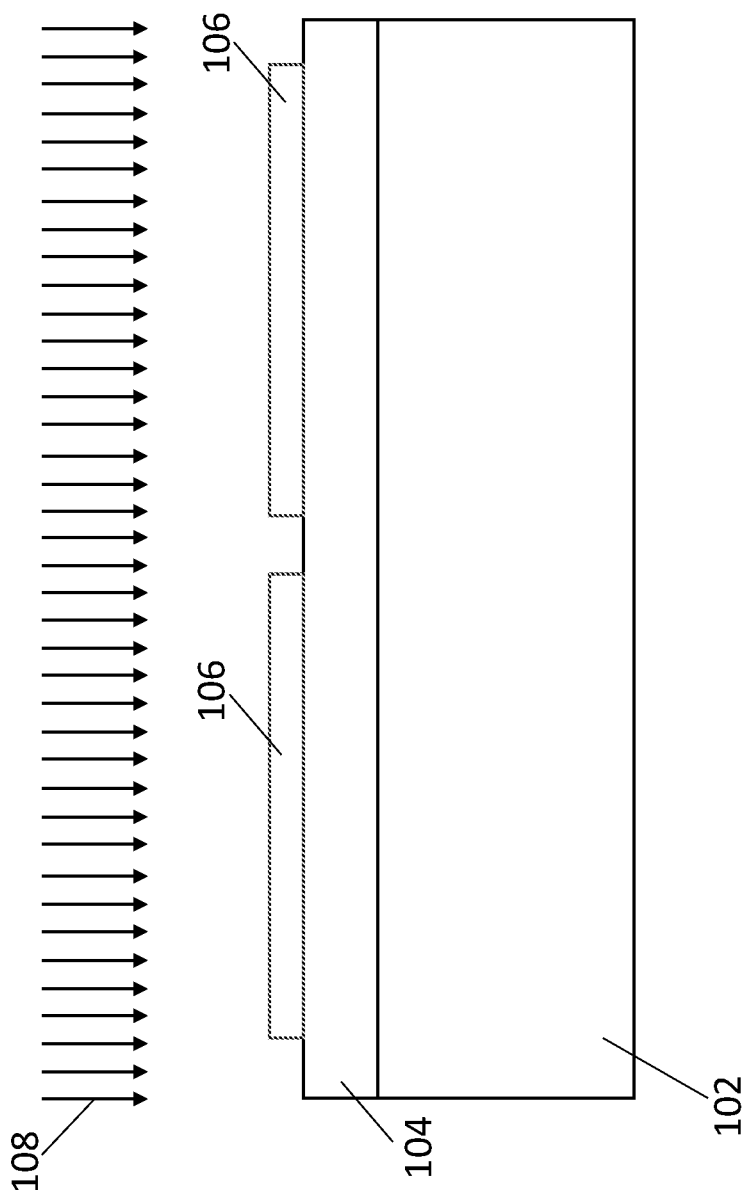
Figure 1C:
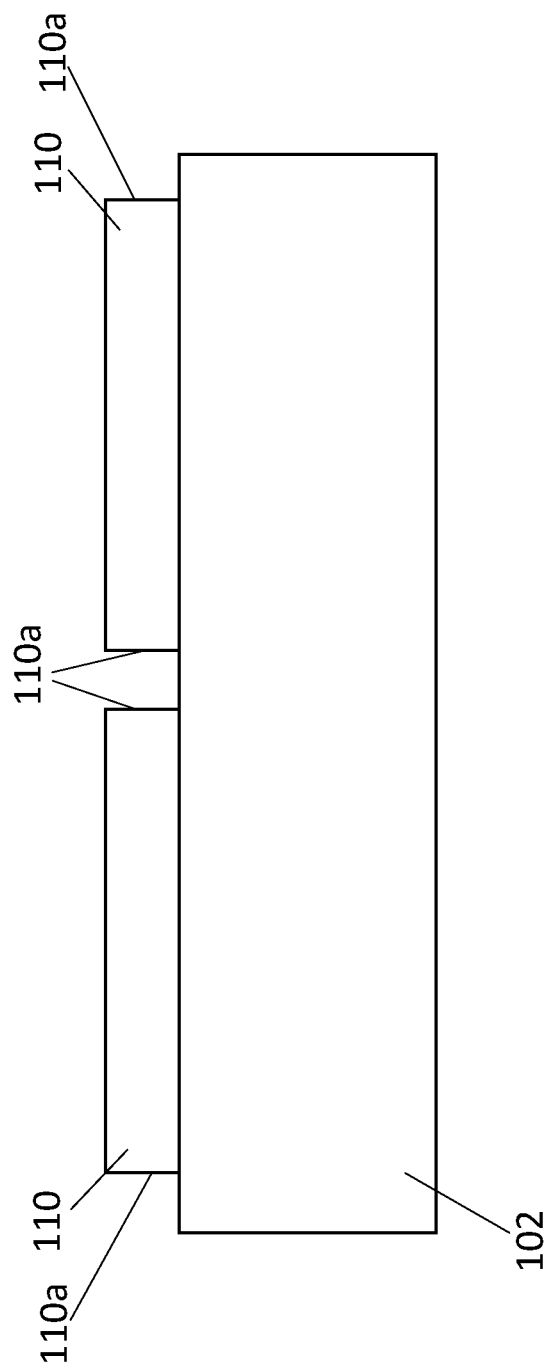

FIG. 1A-1C conceptually illustrate a process for creating an infrared detector in accordance with an embodiment of the invention. In FIG. 1A, a substrate 102 is coated with a planar multi-layer structure 104. In FIG. 1B, the planar multi-layer structure 104 is patterned with a patterning structure 106. The patterning structure 106 may be a photoresist which may be exposed and developed. The planar multi-layer structure 104 may be etched with an etching process 108. The etching process 108 may be a dry etch process or a wet etch process. The wet etch process may utilize citric acid, tartaric acid or tartaric acid with a citric finishing/cleanup step. That wet etch may result in sloped sidewalls and may proceed differently along different crystallographic planes. The dry etch can be performed with a chlorine and argon etching chemistry (e.g. $CH_4/H_2/Ar$ chemistry). The dry etch may be performed at elevated temperatures which may help the III-V chloride evaporate.

Portions of the planar multi-layer structure 104 may be protected from the etching process 108 by the patterning structure 106. In FIG. 1C, the planar multi-layer structure 104 may be etched until a plurality of pixels 110 are positioned onto the substrate 102. The patterning structure 106 may be removed. The plurality of pixels 110 include sidewalls 110a. As discussed above, the sidewalls 110a may include various defects which increase surface current which may have detrimental effects to the performance of the infrared detector. As discussed, a surface treatment may be applied to the sidewalls 110a to mitigate these defects and thus increase the infrared detector performance.

Infrared detectors include Barrier-InfraRed Detector (BIRD) devices. Examples of BIRD devices are described in U.S. Pat. App. Pub. No. 2012/0145996 which is hereby incorporated by reference in its entirety. Further, examples of BIRD devices are described in U.S. Pat. App. Pub. No. 2014/0225064 which is herby incorporated by reference in its entirety. These devices would include a pixel defining step as described above which would create unwanted sidewall defects and sidewall roughness which would be detrimental to device performance. In some embodiments, the below discussed surface treatment process may be utilized to perform the pixel defining etch in order to decrease the amount of the initial surface defects.

Figure 2:
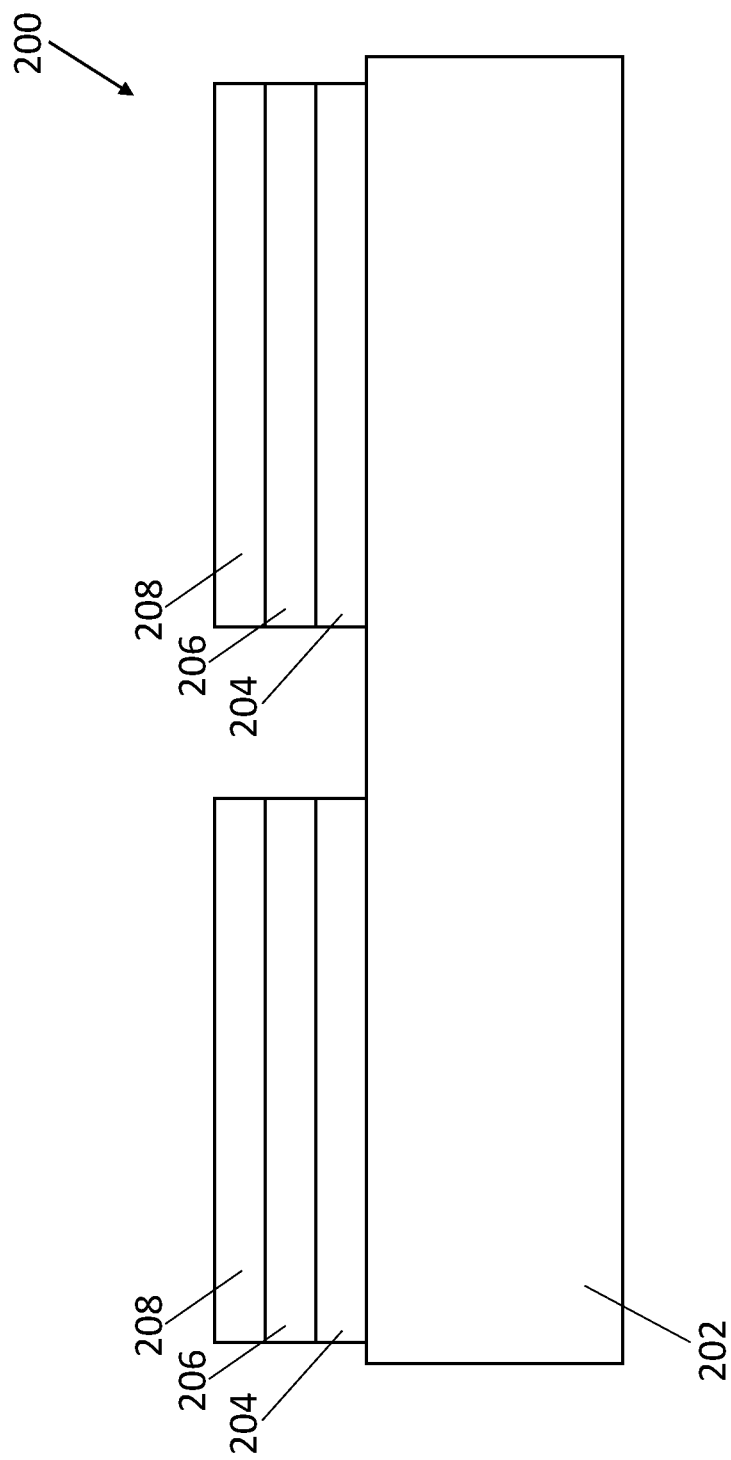
FIG. 2 conceptually illustrates an example of a BIRD device.

FIG. 2 conceptually illustrates an example of a BIRD device. The BIRD device 200 includes a plurality of pixels disposed on a substrate 202. Each of the pixels includes an absorber layer 204, a unipolar barrier layer 206, and a contact layer 208. Operations of the BIRD device are described in U.S. Pat. App. Pub. No. 2012/0145996 and U.S. Pat. App. Pub. No. 2014/0225064. The absorber layer 204 and the contact layer 208 may include a superlattice structure which may be an III-V semiconductor material. For example, each of the absorber layer 204 and the contact layer 208 may include alternating layers of InAs and InAsSb. The contact layer 208 may be a bulk alloy. The absorber layer 204 may include a III-V semiconductor based absorber region. It has been discovered that surface leakage tends to increase as p-type material is used in longer cutoff wavelengths, but the surface treatment described below may be useful with n-type and shorter cutoff devices as well. Specific examples of absorber compositions are: InAs/InAsSb superlattices; GaInSb/InAs superlattices; bulk GaInAsSb or InAsSb.

After pixel delineation, the exposed surfaces may become oxide layers. In the case that the contact layer 208 and/or the absorber layer 204 include InAs/InAsSb superlattices, the oxide layers may be a mixture of indium oxide, arsenic oxide, and/or antimony oxide. Such an exposed surface of a mixture of different oxide structures may create unwanted surface defects and surface roughness. It has been discovered that a surface treatment may both remove the surface oxides and also convert the exposed surfaces into a surface which may decrease surface defects and surface roughness.

The BIRD device is merely exemplary. The surface treatment may also be applicable in infrared detector designs that do not include the unipolar barrier layer 206. Examples include a detector device including a pn junction, pin diode, or other heterojunction detector without the barrier design specific to the BIRD device.

In some embodiments, the surface treatment may include an ALE and/or ALD process. The surface treatment may include a two stepped process. A first step may include an ALE fluorine or fluorocarbon-based process. The first step may include a cyclical process which includes cyclically exposing the sidewalls to alternating fluorine or fluorocarbon reactant and argon gas. The fluorine or fluorocarbon reactant may react with the surface oxides to weaken the bonds of the surface oxides to the underlying sidewall material. Then the ionized argon gas may be used to etch away the surface oxides. The ALE process may be highly controlled to decrease surface oxides and surface roughness without significantly disturbing the underlying sidewall material. The ALE process may be performed at a low temperature.

An example first step includes a dose step which utilizes $CHF_3$ gas. The dose step may be rather long (e.g. between 20-80 seconds). The dose step may be performed with little or no applied bias. The dose step may be cyclically and alternately followed by an etch step. The etch step may utilize Ar gas and may include some bias. The bias may be higher than the dose step.

A subsequent second step may include an ALE chlorine-based process. The chlorine-based process may replace the surface chemistry with stabilizing chlorine which may produce a preferred surface chemistry. The ALE chlorine-based process may include cyclically exposing the sidewalls to alternating chlorine reactant and argon gas. The ALE chlorine-based process may be performed at room temperature. In some embodiments, the temperature of the chlorine-based process may be adjusted which may control the chemical composition and structure of the sidewall.

An example second step includes a dose step which may a very short chlorine argon plasma (e.g. less than 100 ms). The dose step may be cyclically and alternately followed by an etch step. The etch step may be an argon etch step. The argon etch step may be also short (e.g. less than 100 ms). One key feature of the chlorine based atomic layer etching process is that it is performed at near room temperature. The chlorinated III-V compounds may stay on the surface which may treat the sidewall material. There may be a tradeoff between smoothness of the sidewalls and obtaining the right chemistry of chlorine to help form the advantageous sidewall passivation.

Figure 3:
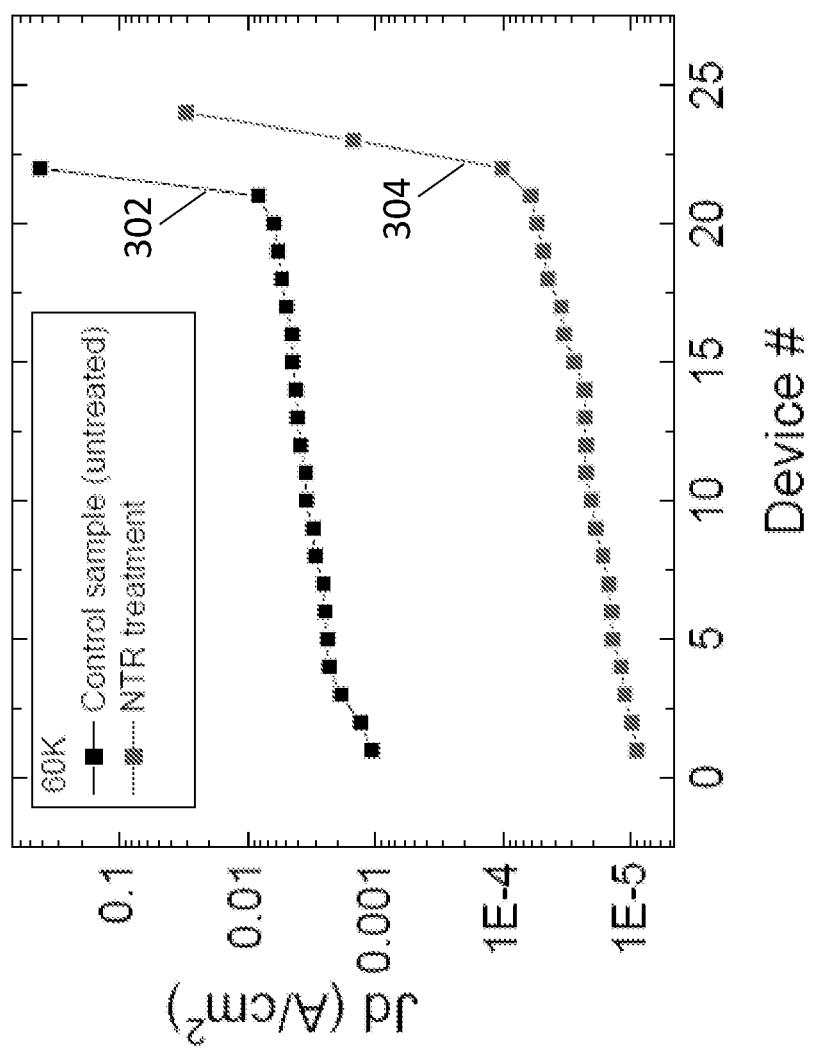
FIG. 3 is a plot illustrating a comparison between an example infrared device without surface treatment and an example infrared device after applied surface treatment.

FIG. 3 is a plot illustrating a comparison between an example infrared device without surface treatment and an example infrared device after applied surface treatment. The x-axis is a series of numbered fabricated devices whereas the y-axis is the dark current. Higher dark current is undesirable. As illustrated, the plot 302 of the example infrared device without surface treatment includes a higher dark current than the plot 304 of the example infrared device with surface treatment.

Figure 4:
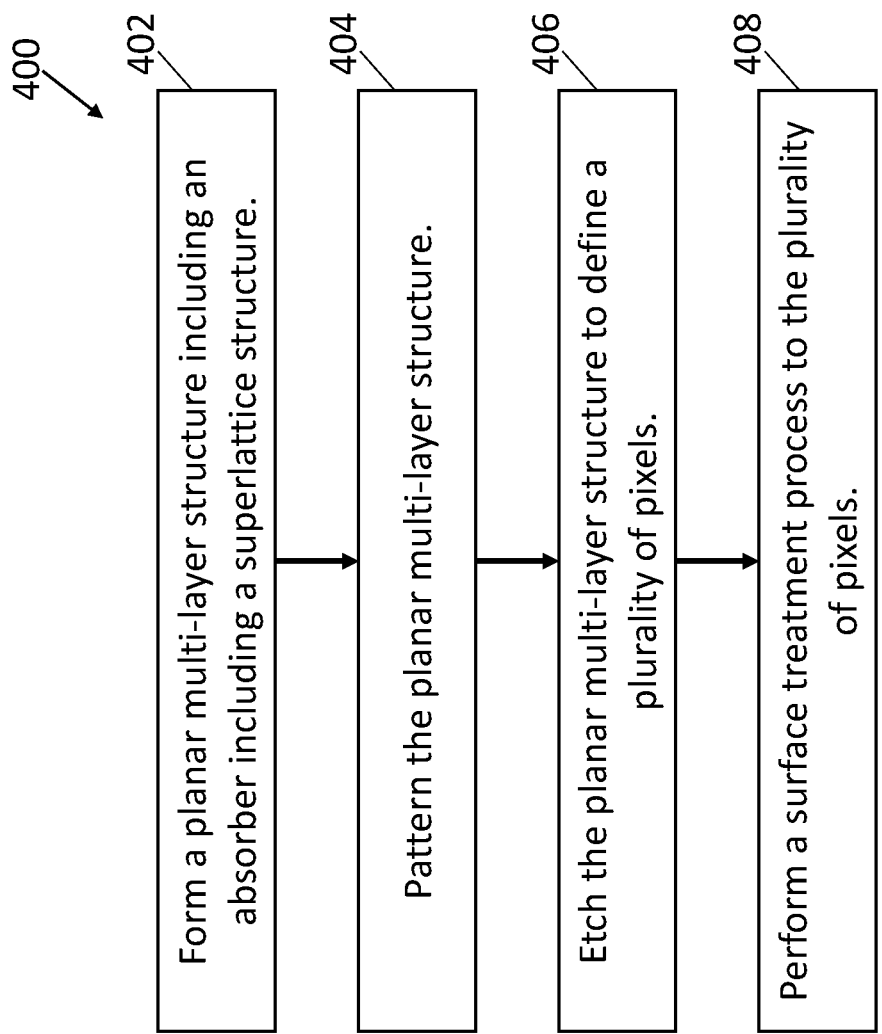
FIG. 4 is a flowchart illustrating a method of producing a low surface current infrared detector in accordance with an embodiment of the invention.

FIG. 4 is a flowchart illustrating a method of producing a low surface current infrared detector in accordance with an embodiment of the invention. The method 400 includes forming (402) a planar multi-layer structure including an absorber including a superlattice structure. The superlattice structure may include compound semiconductors such as InAs/InAsSb superlattice. The method 400 further includes patterning (404) the planar multi-layer structure. etching the planar multi-layer structure to define a plurality of pixels, wherein the sidewalls of the plurality of pixels includes a sidewall roughness and multiple types of surface oxides. The patterning 404 may be performed utilizing a photoresist. The method 400 may further include etching (406) the planar multi-layer structure to define a plurality of pixels. The sidewalls of the plurality of pixels may include a sidewall roughness and multiple types of surface oxides. After etching, exposed surfaces of the compound semiconductor material may include a mixture of different oxide structures may create unwanted surface defects and surface roughness. The method 400 may further include performing (408) a surface treatment process to the plurality of pixels in order to reduce the sidewall roughness and replace the surface oxides with a chlorinated surface morphology.

The surface treatment process may include an atomic layer etching process followed by a different atomic layer etching process. The atomic layer etching process may include cyclically and alternately: exposing the sidewalls of the plurality of pixels to a fluorocarbon reactant; and exposing the sidewalls of the plurality of pixels to an ionized argon gas. The atomic layer deposition process comprises cyclically and alternately: exposing the sidewalls of the plurality of pixels to a chlorine reactant; and exposing the sidewalls of the plurality of pixels to an ionized argon gas.

DOCTRINE OF EQUIVALENTS

While the above description contains many specific embodiments of the invention, these should not be construed as limitations on the scope of the invention, but rather as an example of one embodiment thereof. It is therefore to be understood that the present invention may be practiced in ways other than specifically described, without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

What is claimed is:

1. A method of producing an infrared detector, the method comprising:
   forming a planar multi-layer structure comprising an absorber including a superlattice structure;
   patterning the planar multi-layer structure;
   etching the planar multi-layer structure to define a plurality of pixels, wherein sidewalls of the plurality of pixels include multiple types of surface oxides; and
   performing a surface treatment process to the plurality of pixels in order to replace the surface oxides with a chlorinated surface morphology; wherein the surface treatment process comprises a first atomic layer etching process followed by a second atomic layer deposition process.

2. The method of claim 1, wherein the planar multi-layer structure further comprises a unipolar barrier layer and a contact layer.

3. The method of claim 2, wherein the contact layer comprises a superlattice structure.

4. The method of claim 3, wherein the superlattice structure of the contact layer comprises a compound semiconductor.

5. The method of claim 4, wherein the compound semiconductor comprises InAs and InAsSb.

6. The method of claim 5, wherein the multiple types of surface oxides include indium oxide, arsenic oxide, and antimony oxide.

7. The method of claim 1, wherein the superlattice structure of the absorber comprises a compound semiconductor.

8. The method of claim 7, wherein the compound semiconductor comprises InAs and InAsSb.

9. The method of claim 8, wherein the multiple types of surface oxides include indium oxide, arsenic oxide, and antimony oxide.

10. The method of claim 1, wherein the first atomic layer etching process comprises cyclically and alternately:
exposing the sidewalls of the plurality of pixels to a fluorocarbon reactant; and
exposing the sidewalls of the plurality of pixels to an ionized argon gas.

11. The method of claim 10, wherein the fluorocarbon reactant is $CHF_3$ gas.

12. The method of claim 10, wherein exposing the sidewalls of the plurality of pixels to the fluorocarbon reactant is between 20-80 seconds.

13. The method of claim 10, wherein exposing the sidewalls to the fluorocarbon reactant is performed with substantially no bias.

14. The method of claim 10, exposing the sidewalls to the ionized argon gas includes exposing the sidewalls to argon gas with a bias.

15. The method of claim 14, wherein the bias applied to the ionized argon gas is higher than a bias applied when exposing the sidewalls to the fluorocarbon reactant.

16. The method of claim 1, wherein the second atomic layer deposition process comprises cyclically and alternately:
exposing the sidewalls of the plurality of pixels to a chlorine reactant; and
exposing the sidewalls of the plurality of pixels to an ionized argon gas.

17. The method of claim 16, wherein the chlorine reactant comprises chlorine argon plasma.

18. The method of claim 16, wherein exposing the sidewalls to the chlorine reactant and/or the ionized argon gas is less than 100 ms.

19. The method of claim 16, wherein the second atomic layer deposition process treats the sidewalls with a chlorinated III-V compound.

* * * * *